United States Patent
Lo et al.

(10) Patent No.: US 7,816,978 B1
(45) Date of Patent: Oct. 19, 2010

(54) OPERATING CIRCUIT WITH RC CALIBRATION AND RC CALIBRATION METHOD

(75) Inventors: Tien-Yu Lo, Yilan County (TW); Chuan-Cheng Hsiao, Hsinchu (TW); Kang-Wei Hsueh, Hsinchu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/505,535

(22) Filed: Jul. 20, 2009

(51) Int. Cl.
*H03K 5/00* (2006.01)
(52) U.S. Cl. .................................. 327/553; 327/552
(58) Field of Classification Search ......... 327/551–559, 327/337
See application file for complete search history.

(56) References Cited

U.S. PATENT DOCUMENTS

| | | |
|---|---|---|
| 6,262,603 B1 | 7/2001 | Mohan |
| 6,677,814 B2 | 1/2004 | Low |
| 6,710,644 B2 | 3/2004 | Duncan et al. |
| 7,050,781 B2 * | 5/2006 | Khalil et al. ............. 455/340 |
| 7,176,699 B2 * | 2/2007 | Trochut .................... 324/677 |
| 7,176,754 B2 * | 2/2007 | Baschirotto et al. ........ 327/553 |
| 7,279,962 B2 | 10/2007 | Chen |
| 2006/0256486 A1 | 11/2006 | Kim et al. |

* cited by examiner

*Primary Examiner*—Dinh T. Le
(74) *Attorney, Agent, or Firm*—Winston Hsu; Scott Margo; Min-Lee Teng (57) ABSTRACT

An operating circuit includes an amplifier having a first input terminal coupled to a reference voltage; a first transconducting element for selectively generating a first current; a second transconducting element for selectively generating a second current; a resistive element having a first terminal coupled to the first transconducting element; a capacitive element having a first terminal selectively coupled to the second transconducting element; and a switching device. The switching device has a first configuration to connect the first terminal of the capacitive element to the second transconducting element and connect the first terminal of the resistive element to a second input terminal of the amplifier, and has a second configuration to disconnect the first terminal of the capacitive element from the second transconducting element and connect the second input terminal of the amplifier to the first terminal of the capacitive element instead of the first terminal of the resistive element.

15 Claims, 7 Drawing Sheets

ABSTRACT

OPERATING CIRCUIT WITH RC CALIBRATION AND RC CALIBRATION METHOD

BACKGROUND

The present invention relates to an RC calibration circuit and method thereof, and more particularly to an RC calibration circuit that utilizes an amplifier to generate a charging current under a charging mode and utilizes the amplifier to operate as a comparator under a comparing mode, and a method thereof.

When a passive element, such as a resistor or a capacitor, is fabricated in an integrated circuit, the variation of semiconductor processing may seriously affect the accuracy of the electrical characteristic of the passive element. For the example of a filter comprising a resistor and capacitor, a corner frequency as well as time constant of the filter is determined by the resistance of the resistor and the capacitance of the capacitor. When process variation occurs, the corner frequency of the filter is varied. As a result, the frequency band of the filter may deviate from the required band of the circuit system, and consequently affect the efficiency of the circuit system. To overcome the above-mentioned problem, a calibration mechanism can be built in the integrated circuit to calibrate the resistance of the resistor or the capacitance of the capacitor fabricated in the integrated circuit. The conventional calibration mechanism, however, may also greatly increase the area of the integrated circuit as well as the cost. Therefore, providing an efficient and low cost calibration mechanism to calibrate the resistor and the capacitor in the integrated circuit is a significant concern in the circuit design field.

SUMMARY OF THE INVENTION

One of the objectives of the present invention is to provide an RC calibration circuit that utilizes an amplifier to generate a charging current under a charging mode and utilizes the amplifier to operate as a comparator under a comparing mode, and a method thereof.

According to an embodiment of the present invention, an operating circuit is provided. The operating circuit comprises an amplifier, a first transconducting element, a second transconducting element, a resistive element, a capacitive element, and a switching device. The amplifier has a first input terminal coupled to a reference voltage. The first transconducting element is coupled to an output terminal of the amplifier for selectively generating a first current according to an output of the amplifier. The second transconducting element is coupled to the output terminal of the amplifier for selectively generating a second current according to the output of the amplifier. The resistive element has a first terminal coupled to the first transconducting element. The capacitive element has a first terminal selectively coupled to the second transconducting element, wherein at least one of the resistive element and the capacitive element is an adjustable element. The switching device has a first configuration under a first mode of the operating circuit that connects the first terminal of the capacitive element to the second transconducting element and connects the first terminal of the resistive element to a second input terminal of the amplifier, and has a second configuration under a second mode of the operating circuit that disconnects the first terminal of the capacitive element from the second transconducting element and connects the second input terminal of the amplifier to the first terminal of the capacitive element instead of the first terminal of the resistive element.

According to the embodiment of the present invention, an RC calibration method is disclosed. The RC calibration method comprises the steps of: providing an amplifier having a first input terminal coupled to a reference voltage; selectively generating a first current according to an output of the amplifier; selectively generating a second current according to the output of the amplifier; providing a resistive element having a first terminal coupled to the first current; providing a capacitive element having a first terminal selectively coupled to the second current, wherein at least one of the resistive element and the capacitive element is an adjustable element; connecting the first terminal of the capacitive element to the second current and connecting the first terminal of the resistive element to a second input terminal of the amplifier under a first mode; and disconnecting the first terminal of the capacitive element from the second current and connecting the second input terminal of the amplifier to the first terminal of the capacitive element instead of the first terminal of the resistive element under a second mode.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
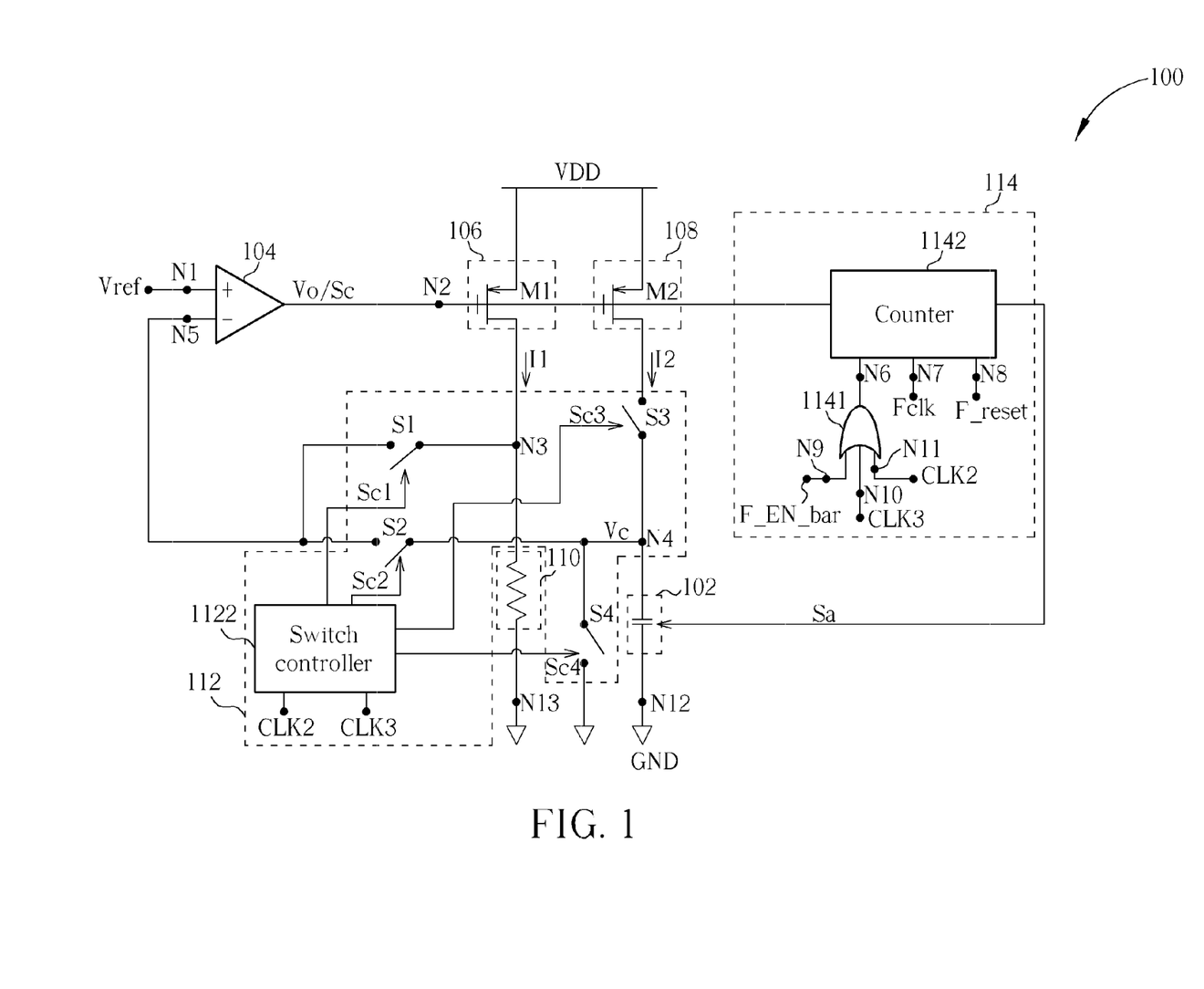
FIG. 1 is a diagram illustrating an operating circuit according to an embodiment of the present invention.

Please refer to FIG. 1. FIG. 1 is a diagram illustrating an operating circuit 100 according to an embodiment of the present invention, wherein the operating circuit 100 is operable to calibrate a capacitance of a capacitive element 102 in the operating circuit 100. Please note that, although the operating circuit 100 and the capacitive element 102 are fabricated in an integrated circuit in this embodiment, this is not meant to be a limitation of the present invention. A person with ordinary skill in the art should appreciate that the operating circuit 100 may be modified to calibrate a capacitance of a capacitor arranged externally to the operating circuit 100. The operating circuit 100 comprises an amplifier 104, a first transconducting element 106, a second transconducting element 108, a resistive element 110, the capacitive element 102, a switching device 112, and a control device 114.

The amplifier 104 has a first input terminal N1 coupled to a reference voltage Vref, a second input terminal N5 and an output terminal N2. The first transconducting element 106 may comprise a field-effect transistors M1, having a gate terminal coupled to the output terminal N2 of the amplifier 104 and a source terminal coupled to a supply voltage VDD, for selectively generating a first current I1 according to an output Vo of the amplifier 104. The second transconducting element 108 may comprise a field-effect transistors M2, having a gate terminal coupled to the output terminal N2 of the amplifier 104 and a source terminal coupled to the supply voltage VDD, for selectively generating a second current I2 according to the output of the amplifier Vo. The transistors M1 and M2 are configured as a current mirror having a mirroring ratio of M:1; i.e. the size (width/length) of the P type field-effect transistor M1 is M times larger than the size of the P type field-effect transistor M2. The resistive element 110 has a first terminal N3 coupled to the first transconducting element 106. The capacitive element 102 has a first terminal N4 selectively coupled to the second transconducting element 108. In this embodiment, the capacitive element 102 is an adjustable capacitive element.

The operating system 100 operates under three modes: charging mode, comparing mode and discharging mode. The switching device 112 also has three corresponding configurations. In the first configuration corresponding to the charging mode, the switch S3 connects the first terminal N4 of the capacitive element 102 to the second transconducting element 108, switch S1 connects the first terminal N3 of the resistive element 110 to the second input terminal N5 of the amplifier 104, switch S2 disconnects the first terminal N4 of the capacitive element 102 to the second input terminal N5 of the amplifier 104, and switch S4 disconnects the terminal N4 of the capacitive element 102 from the ground GND. In the second configuration corresponding to the comparing mode, the switch S3 disconnects the first terminal N4 of the capacitive element 102 from the second transconducting element 108, switch S2 connects the second input terminal N5 of the amplifier 104 to the first terminal N4 of the capacitive element 102, and switch S1 disconnects the second input terminal N5 of the amplifier 104 from the first terminal N3 of the resistive element 110. In the third configuration corresponding to the discharging mode, the switch S4 connects the first terminal N4 of the capacitive element 102 to the ground GND, the switch S1 connects the second input terminal N5 of the amplifier 104 to the first terminal N3 of the resistive element 110, and the switch S2 disconnects the second input terminal N5 of the amplifier 104 from the first terminal N4 of the capacitive element 102.

Therefore, under the charging mode, the operating circuit 100, the amplifier 104, the first transconducting element 106, the second transconducting element 108, and the resistive element 110 are arranged to drive the capacitive element 102 to generate a voltage level at the first terminal N4 of the capacitive element 102. Under the comparing mode of the operating circuit 100, the amplifier 104 is arranged to compare the voltage level at the first terminal N4 of the capacitive element 102 and the reference voltage Vref to generate a compared signal Sc. Please note that, to more clearly illustrate the operation of the operating circuit 100, the output of the amplifier 104 is denoted as Vo under the charging mode, and the output of the amplifier 104 is denoted as Sc under the comparing mode.

The control device 114 is coupled to the output terminal N2 of the amplifier 104 for receiving the compared signal Sc under the comparing mode and selectively generating an adjusting signal Sa to adjust the capacitance of the adjustable capacitive element 102 according to at least the compared signal Sc. When the compared signal Sc indicates that the voltage level at the terminal N4 is greater than the reference voltage Vref, the control device 114 generates the adjusting signal Sa to increase the capacitance of the capacitive element 102. On the other hand, when the compared signal Sc indicates that the voltage level at the terminal N4 is lower than the reference voltage Vref, the control device 114 generates the adjusting signal Sa to decrease the capacitance of the capacitive element 102. To stabilize the adjustment, in one embodiment, the control device 114 comprises a counter 1142 to average data contained in the compared signal Sc generated under the comparing mode. In one embodiment, the counter 1142 sends the adjusting signal Sa when the comparison results of the amplifier 104 indicates that the voltage level at the terminal N4 is lower (or greater) than the reference voltage Vref in several consecutive cycles. The counter 1142 has a first terminal N6 coupled to an OR gate 1141 for receiving a latching signal, a second terminal N7 for receiving an reference clock signal Fclk, and a third terminal N8 for receiving a reset signal F_reset. The OR gate 1141 has three input terminals N9, N10, N11, in which the first terminal N9 is coupled to an enabling signal F_EN_bar for enabling the counter 1142, the second input terminal N11 is coupled to a first clock signal CLK2, and the third input terminal N10 is coupled to a second clock signal CLK3.

Figure 2:
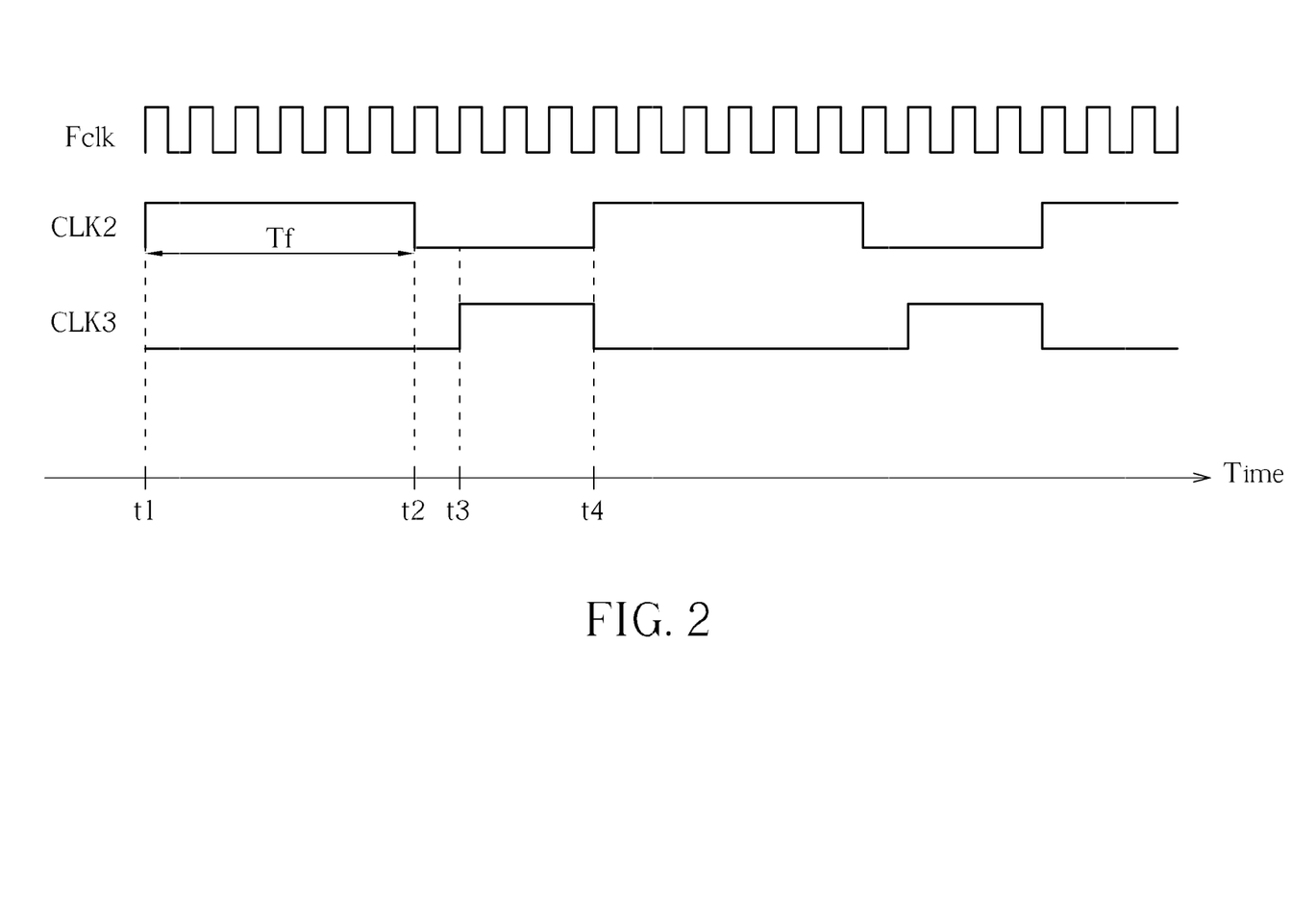
FIG. 2 is a timing diagram illustrating a reference clock signal, a first clock signal, and a second clock signal of the operating circuit.

The switch controller 1122 controls the first switch S1, the second switch S2, the third switch S3, and the fourth switch S4 according to the clock signals CLK2 and CLK3. Please refer to FIG. 2. FIG. 2 is a timing diagram illustrating the reference clock signal Fclk, the first clock signal CLK2, and the second clock signal CLK3 of the operating circuit 100. The reference clock signal Fclk has a duty cycle substantially equal to 50%, and is inputted to the counter 1142 to be the operating clock of the counter 1142. Furthermore, the reference clock signal Fclk is synchronized with the clock signals CLK2 and CLK3 as shown in FIG. 2. In this embodiment, the operating circuit 100 enters the charging mode when the clock signal CLK 2 is at a high voltage level and the clock signal CLK3 is at a low voltage level (e.g. t1-t2); enters the comparing mode when the clock signal CLK 2 is at a low voltage level and the clock signal CLK3 is at a low voltage level (e.g. t2-t3); and enters the discharging mode when the clock signal CLK 2 is at a high voltage level and the clock signal CLK3 is at a high voltage level (e.g. t3-t4). Therefore, the control signal Sc1 for switch S1 could be an OR operation upon the clock signals CLK2 and CLK3. The control signal Sc2 for switch S2 could be an XOR (Exclusive OR) operation upon the clock signals CLK2 and CLK3. The control signal Sc3 for switch S3 could correspond to the clock signal CLK2. The control signal Sc4 for the switch S4 could correspond to the clock signal CLK3.

Figure 3:
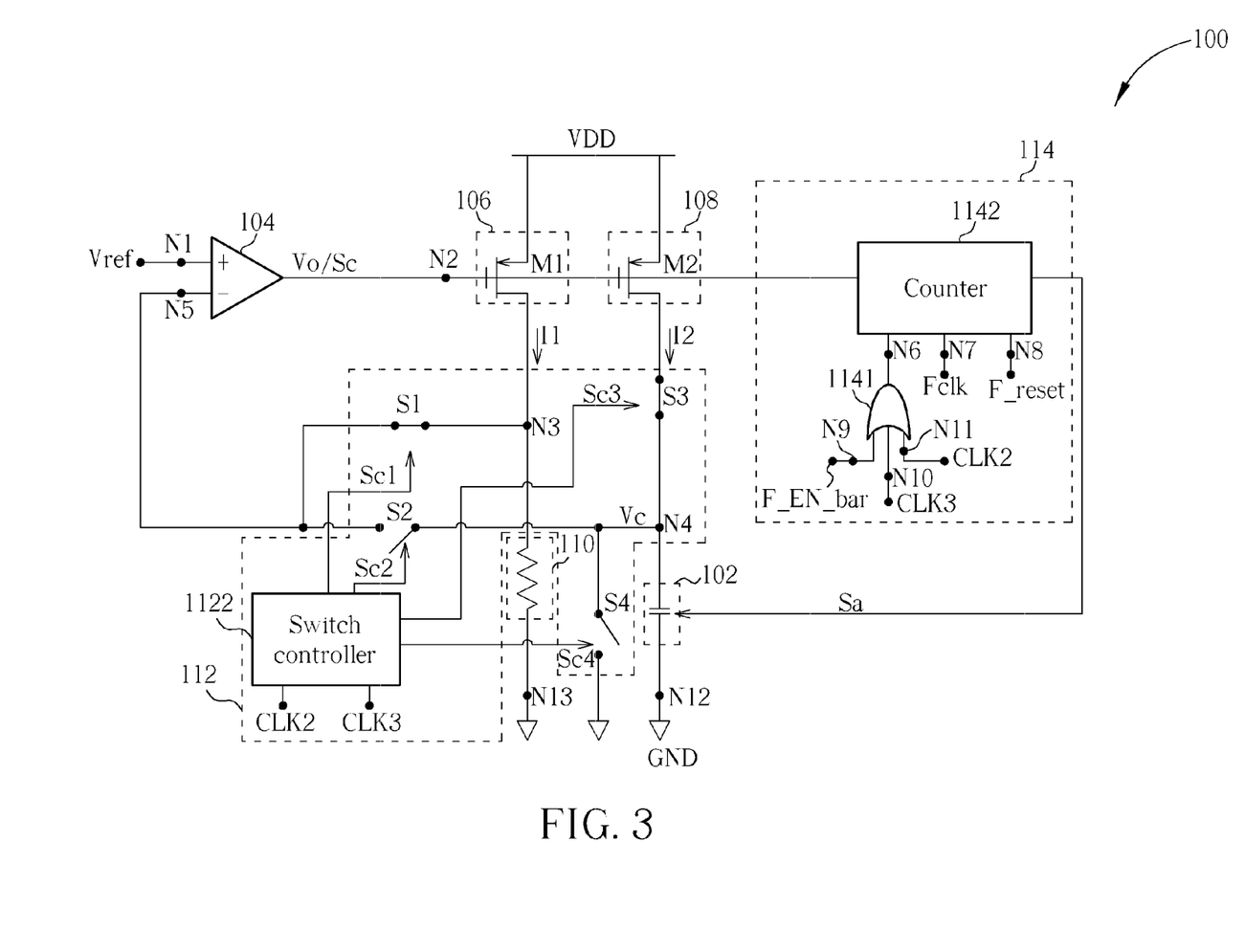
FIG. 3 is a diagram illustrating the operating circuit operating under a charging mode.

Please refer to FIG. 2 again. The high voltage level time interval Tf of the clock signal CLK2 is defined as a target time constant constituted by the resistance of the resistive element 110 and a target capacitance of the capacitive element 102. The time interval Tf is a predetermined value. After the operating circuit 100 is enabled and the counter 1142 is reset, the switch controller 1122 outputs the first control signal Sc1 to turn on (i.e. close) the first switch S1, outputs the second control signal Sc2 to turn off (i.e. open) the second switch S2, outputs the third control signal Sc3 to turn on the third switch S3, and outputs the fourth control signal Sc4 to turn off the fourth switch S4 at time t1 as shown in FIG. 3. FIG. 3 is a diagram illustrating the operating circuit 100 operating under the charging mode. Then, the second current I2 generated by the second transconducting element 108 charges the capacitive element 102 for a time Tf, in which it is assumed that no electric charge exists in the capacitive element 102 and the capacitance of the capacitive element 102 is a predetermined capacitance initially determined by the adjusting signal Sa. It should be noted that, under the charging mode, the amplifier 104, the P type field-effect transistor M1, and the resistive element 110 are arranged to form a feedback loop, and the first current I1 is equal to Vref/r, wherein r is the resistance of the resistive element 110. The first current I1 is then mirrored to the P type field-effect transistor M2 to generate the second current I2 under the mirroring ratio of M:1.

Figure 4:
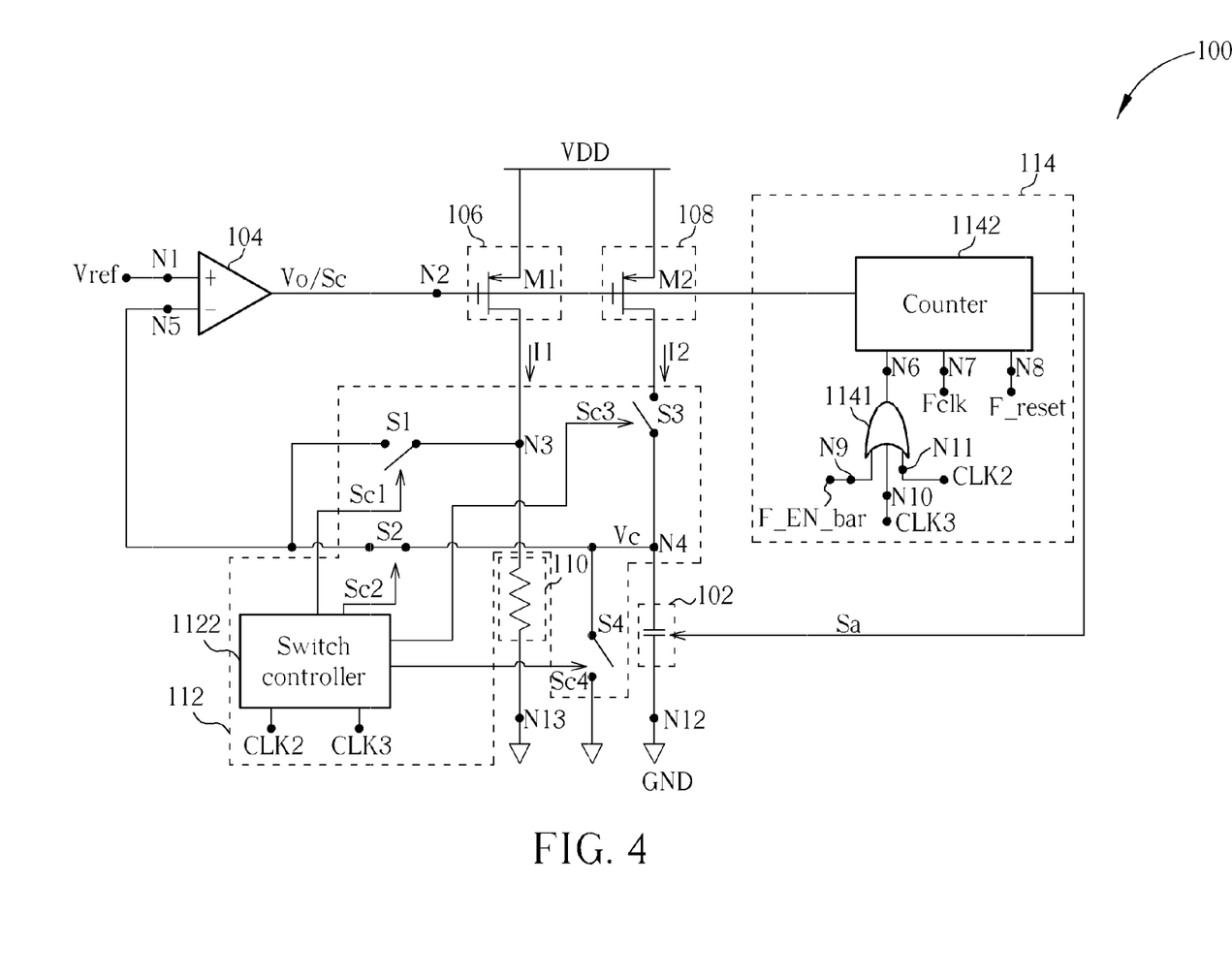
FIG. 4 is a diagram illustrating the operating circuit operating under a comparing mode.

At time t2, i.e. after Tf is elapsed, the switch controller 1122 turns off the first switch S1, turns on the second switch S2, turns off the third switch S3, and turns off the fourth switch S4 as shown in FIG. 4. FIG. 4 is a diagram illustrating the operating circuit 100 operating under the comparing mode. Under the comparing mode, the amplifier 104 is operated as a comparator to compare the reference voltage Vref and a voltage level Vc at the first terminal N4 generated under the charging mode. When the voltage level Vc is higher than the reference voltage Vref, the compared signal Sc generated by the amplifier 104 indicates that the current capacitance of the capacitive element 102 is smaller than the desired target capacitance, whereas when the voltage level Vc is lower than the reference voltage Vref, the compared signal Sc indicates that the current capacitance of the capacitive element 102 is larger than the desired target capacitance. Then, the control device 114 generates the adjusting signal Sa to adjust the capacitance of the capacitive element 102.

Figure 5:
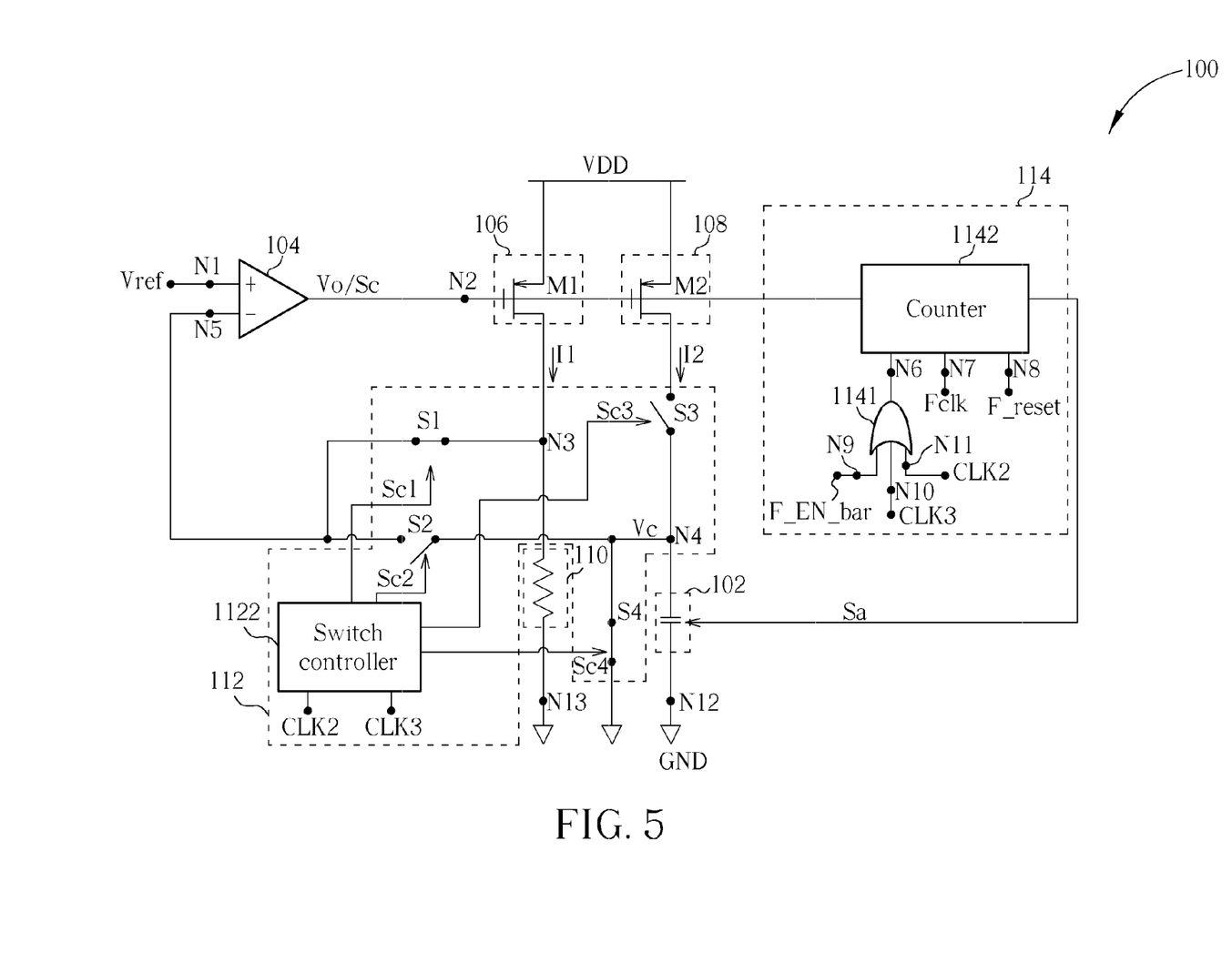
FIG. 5 is a diagram illustrating the operating circuit operating under a discharging mode.

After the comparing mode, the operating circuit 100 enters the discharging mode. In the time interval between time t3 and t4, the switch controller 1122 turns on the first switch S1, turns off the second switch S2, turns off the third switch S3, and turns on the fourth switch S4 as shown in FIG. 5. FIG. 5 is a diagram illustrating the operating circuit 100 operating under the discharging mode. Under the discharging mode, the electric charge of the capacitive element 102 is discharged to the ground, i.e., the ground voltage GND, through the fourth switch S4; meanwhile the feedback loop formed by the amplifier 104, the P type field-effect transistor M1, and the resistive element 110 are established by the first switch S1. After the discharging mode, the operating circuit 100 enters the charging mode again.

Please note that, to stabilize the adjustment and accurately determine whether the current capacitance of the capacitive element 102 is larger or smaller than the target capacitance, the control device 114 may generate the adjusting signal Sa according to a statistical result generated from a plurality of compared signals Sc. For example, the control device 114 may generate the adjusting signal Sa when the number of times the operating circuit 100 enters the charging mode reaches a predetermined number. Please note that the present invention does not limit the manner of obtaining the statistical result. In one of the embodiments of the present invention, the statistical result may be an average result of the predetermined number of compared signals Sc. The counter 1142 may count the number of occurrences that the current capacitance of the capacitive element 102 is larger than the target capacitance, and count the number of occurrences that the current capacitance of the capacitive element 102 is smaller than the target capacitance. When the number of occurrences showing that the current capacitance of the capacitive element 102 is larger than the target capacitance is larger than the number of occurrences showing that the current capacitance of the capacitive element 102 is smaller than the target capacitance, the control device 114 may output the adjusting signal Sa to reduce capacitance of the capacitive element, and vice versa. Furthermore, when the number of occurrences that the current capacitance of the capacitive element 102 is larger than the target capacitance is equal to the number of occurrences that the current capacitance of the capacitive element 102 is smaller than the target capacitance, the control device 114 may determine that the current capacitance of the capacitive element 102 is equal to the target capacitance, and latch the current setting of the capacitive element 102.

When the control device 114 determines that the current capacitance of the capacitive element 102 is equal to the target capacitance, the time constant constituted by the resistance of the resistive element 110 and the capacitance of the capacitive element 102 is equal to Tf, i.e., the high voltage level time interval Tf of the clock signal CLK2. Accordingly, the time constant can be calibrated to a predetermined value, i.e., Tf.

Figure 6:
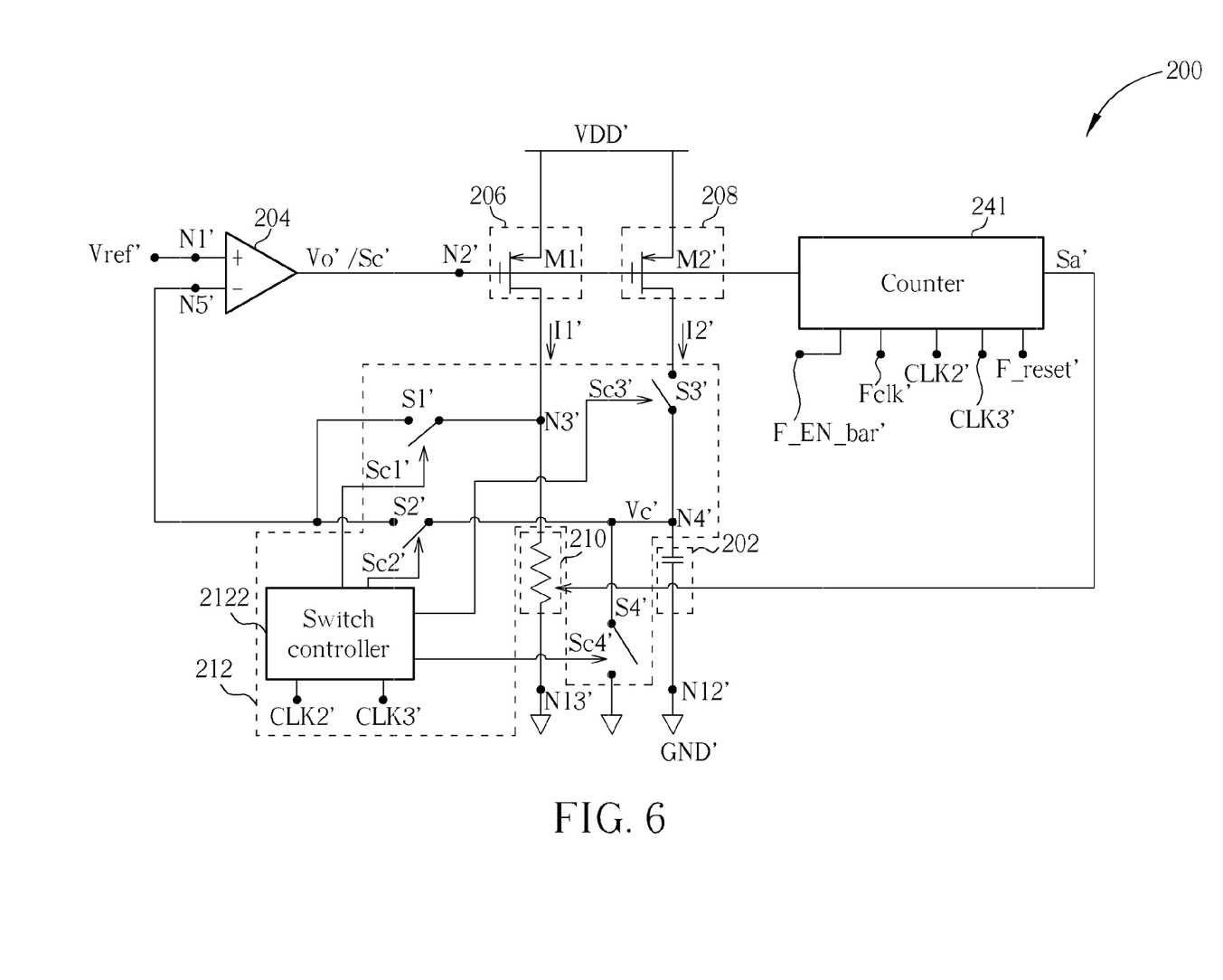
FIG. 6 is a diagram illustrating an operating circuit according to a second embodiment of the present invention.

Please refer to FIG. 6. FIG. 6 is a diagram illustrating an operating circuit 200 according to a second embodiment of the present invention, wherein the operating circuit 100 is operable to calibrate a resistance of a resistive element 210 in the operating circuit 200. The operating circuit 200 comprises an amplifier 204, a first transconducting element 206, a second transconducting element 208, an adjustable resistive element 210, the capacitive element 202, a switching device 212, and a control device 214.

Similar to the operating system 100, the operating system 200 has a charging mode, comparing mode and a discharging mode, and the switching device 212 has three configurations corresponding to the three modes. In the first configuration, the switching device 212 connects the first terminal N4' of the capacitive element to the second transconducting element 208 and connects the first terminal N3' of the resistive element 210 to a second input terminal N5' of the amplifier 204. In the second configuration under the comparing mode, the switching device 212 disconnects the first terminal N4' of the capacitive element 202 from the second transconducting element 208 and connects the second input terminal N5' of the amplifier 204 to the first terminal N4' of the capacitive element 202 instead of the first terminal N3' of the resistive element 210. In the third configuration under the discharging mode, the switching device 212 connects the first terminal N4' of the capacitive element 202 to the ground voltage GND'.

Therefore, under the charging mode, the operating circuit 200, the amplifier 204, the first transconducting element 206, the second transconducting element 208, and the resistive element 210 are arranged to drive the capacitive element 202 to generate a voltage level at the first terminal N4' of the capacitive element 202. Under the comparing mode of the operating circuit 200, the amplifier 204 is arranged to compare the voltage level at the first terminal N4' of the capacitive element 202 and the reference voltage Vref' to generate a compared signal Sc'. Please note that, to more clearly illustrate the operation of the operating circuit 200, the output of the amplifier 204 is denoted as Vo' under the charging mode, and the output of the amplifier 204 is denoted as Sc' under the comparing mode.

In this embodiment, the control device 214 is coupled to the output terminal N2' of the amplifier 204 for reading the compared signal Sc' under the comparing mode of the operating circuit 200 and selectively generating an adjusting signal Sa' to adjust the adjustable resistive element 210 according to at least the compared signal Sc'. Similar to the embodiment as shown in FIG. 1, the control device 214 further couples to a reference clock signal Fclk', clock signals CLK2', CLK3', a reset signal F_reset', and an enabling signal F_EN_bar'.

Compared to the embodiment shown in FIG. 1, the control device 214 adjusts the adjustable resistive element 210 rather than the capacitive element 202 to calibrate the time constant constituted by the resistive element 210 and the capacitive element 202 into a predetermined time constant. By referencing the charging mode, the comparing mode, and the discharging mode as disclosed in the operating circuit 100, the control device 214 adjusts the resistance of the resistive element 210 to change the first current I1' and the second current I2' according to the compared signal Sc', wherein the second current I2' is utilized to charge the capacitive element 202. Similar to the operating circuit 100, the target time constant of the operating circuit 200 is predetermined, thus the charging time under the charging mode of the operating circuit 200 is also predetermined. By varying the second current I2', the voltage at the first terminal N4' charged in the charging time will finally be calibrated into the reference voltage Vref'. When the voltage at the first terminal N4' charged in the charging time is equal to the reference voltage Vref', the time constant constituted by the current resistance of the resistive element 210 and the capacitance of the capacitive element 202 is determined to be equal to the predetermined time constant. Accordingly, the time constant constituted by the resistance of the resistive element 210 and the capacitance of the capacitive element 202 is calibrated.

Figure 7:
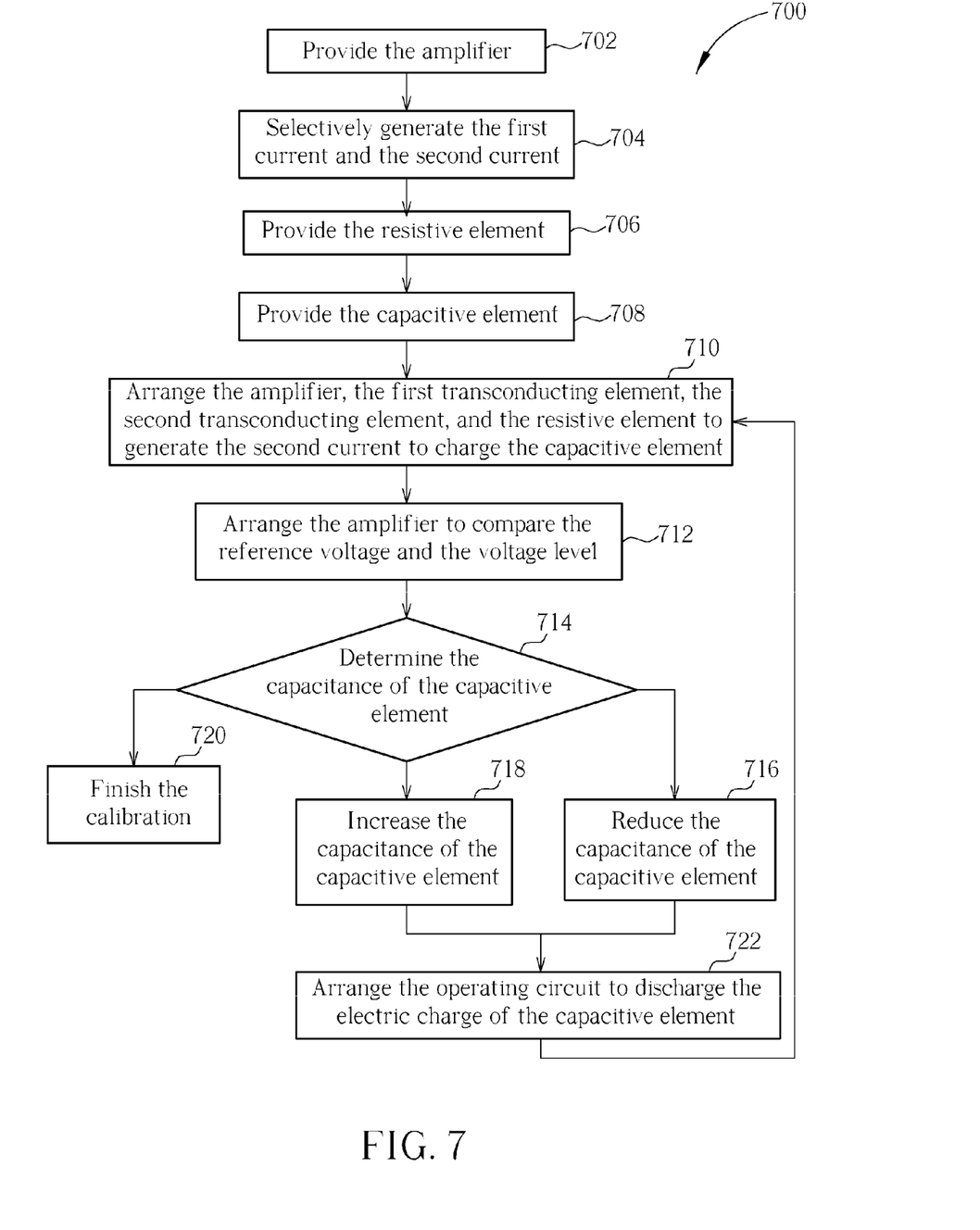
FIG. 7 is a diagram illustrating a RC calibration method according to a third embodiment of the present invention.

Please refer to FIG. 7. FIG. 7 is a diagram illustrating an RC calibration method 700 according to an embodiment of the present invention. The RC calibration method 700 is applicable in the above-mentioned operating circuit 100, thus the RC calibration method 700 is described in conjunction with the operating circuit 100. Provided that substantially the same result is achieved, the steps of the flowchart shown in FIG. 7 need not be in the exact order shown and need not be contiguous, that is, other steps can be intermediate. The RC calibration method 700 comprises the following steps:

Step 702: Provide the amplifier having the first input terminal N1 coupled to the reference voltage Vref;

Step 704: Selectively generate the first current I1 and the second current I2 according to the output of the amplifier 104;

Step 706: Provide the resistive element 110 having the first terminal N3 coupled to the first current I1;

Step 708: Provide the capacitive element 102 having the first terminal N4 selectively coupled to the second current I2, wherein the capacitive element 102 is an adjustable passive element;

Step 710: Arrange the amplifier 104, the first transconducting element 106, the second transconducting element 108, and the resistive element 110 to generate the second current I2 to charge the capacitive element 102 to generate the voltage level Vc under the charging mode;

Step 712: Arrange the amplifier 104 to compare the reference voltage Vref and the voltage level Vc to generate the compared signal Sc under the comparing mode;

Step 714: Generate the statistical result according to the compared signal Sc; if the statistical result shows that the capacitance of the capacitive element 102 is larger than the target capacitance, go to Step 716, if the statistical result shows that the capacitance of the capacitive element 102 is smaller than the target capacitance, go to Step 718, and if the statistical result shows that the capacitance of the capacitive element 102 is equal to the target capacitance, go to Step 720;

Step 716: Adjust the capacitive element 102 to reduce the capacitance of the capacitive element 102, and go to Step 722;

Step 718: Adjust the capacitive element 102 to increase the capacitance of the capacitive element 102, and go to Step 722;

Step 720: Finish the calibration and ascertain that the time constant constituted by the resistive element 110 and the capacitive element 102 is equal to the predetermined time constant, i.e., Tf;

Step 722: Arrange the operating circuit 100 to discharge the electric charge of the capacitive element 102, and go to Step 710.

According to the present invention, under the charging mode, the operating circuit 100, the amplifier 104, the first transconducting element 106, the second transconducting element 108, and the resistive element 110 are arranged to drive the capacitive element 102 to generate the voltage level at the first terminal N4 of the capacitive element 102. Under the comparing mode of the operating circuit 100, the amplifier 104 is arranged to compare the voltage level at the first terminal N4 of the capacitive element 102 and the reference voltage Vref to generate a compared signal Sc.

In Step 714, the statistical result may be generated according to a predetermined number of compared signals Sc. In this embodiment, a counter is utilized to count the number of occurrences of the compared signal Sc showing that the current capacitance of the capacitive element 102 is larger than the target capacitance in the predetermined number of compared signals Sc, and to count the number of occurrences of the compared signal Sc showing that the current capacitance of the capacitive element 102 is smaller than the target capacitance in the predetermined number of compared signals Sc.

In short, the present invention utilizes one amplifier 104 to generate the charging current I2 under the charging mode and utilizes the amplifier 104 to operate as a comparator for comparing the reference voltage Vref and the voltage level Vc under the comparing mode. By adjusting either the resistance of the resistive element 110 or the capacitance of the capacitive element 102, the time constant constituted by the resistive element 110 and the capacitive element 102 can be calibrated to a predetermined time constant.

Those skilled in the art will readily observe that numerous modifications and alterations of the device and method may be made while retaining the teachings of the invention.

What is claimed is:

1. An operating circuit, comprising:
   an amplifier, having a first input terminal coupled to a reference voltage;
   a first transconducting element, coupled to an output terminal of the amplifier for selectively generating a first current according to an output of the amplifier;
   a second transconducting element, coupled to the output terminal of the amplifier for selectively generating a second current according to the output of the amplifier;
   a resistive element, having a first terminal coupled to the first transconducting element;
   a capacitive element, having a first terminal selectively coupled to the second transconducting element, wherein at least one of the resistive element and the capacitive element is an adjustable element; and
   a switching device, coupled to the amplifier, the first transconducting element, the second transconducting element, the resistive element, and the capacitive element, wherein the switching device is arranged to have a first configuration under a first mode of the operating circuit to connect the first terminal of the capacitive element to the second transconducting element and connect the first terminal of the resistive element to a second input terminal of the amplifier, and is arranged to have a second configuration under a second mode of the operating circuit to disconnect the first terminal of the capacitive element from the second transconducting element and connect the second input terminal of the amplifier to the first terminal of the capacitive element instead of the first terminal of the resistive element.

2. The operating circuit of claim 1, wherein the first transconducting element comprises a first field-effect transistor having a gate terminal coupled to the output terminal of the amplifier, a first terminal coupled to a supply voltage, and a second terminal coupled to the resistive element, and the second transconducting element comprises a second field-effect transistor having a gate terminal coupled to the output terminal of the amplifier, a first terminal coupled to the supply voltage, and a second terminal coupled to the switching device.

3. The operating circuit of claim 1, wherein the amplifier, the first transconducting element, the second transconducting element, and the resistive element are arranged to drive the capacitive element to generate a voltage level at the first terminal of the capacitive element under the first mode of the operating circuit, the amplifier is arranged to compare the voltage level at the first terminal of the capacitive element and the reference voltage to generate a compared signal under the second mode of the operating circuit, and the operating circuit further comprises:
a control device, coupled to the output terminal of the amplifier, for receiving the compared signal under the second mode of the operating circuit and selectively generating an adjusting signal to adjust the adjustable element according to at least the compared signal.

4. The operating circuit of claim 3, wherein each time the operating circuit enters the second mode, the amplifier generates one compared signal; each time the operating circuit enters the first mode, the control device further counts a number of times of the operating circuit entering the first mode; and when the number of times of the operating circuit entering the first mode reaches a predetermined number, the control device generates a statistical result by performing a statistical operation upon a plurality of compared signals each generated due to the operating circuit entering the second mode, and generates the adjusting signal according to the statistical result of the compared signals.

5. The operating circuit of claim 4, wherein the adjustable element is the resistive element, when the statistical result shows that the reference voltage is higher than the voltage level at the first terminal of the capacitive element, the control device outputs the adjusting signal to reduce resistance of the resistive element, and when the statistical result shows that the reference voltage is lower than the voltage level at the first terminal of the capacitive element, the control device outputs the adjusting signal to increase resistance of the resistive element.

6. The operating circuit of claim 4, wherein when the adjustable element is the capacitive element, when the statistical result shows that the reference voltage is higher than the voltage level at the first terminal of the capacitive element, the control device outputs the adjusting signal to reduce capacitance of the capacitive element, and when the statistical result shows that the reference voltage is lower than the voltage level at the first terminal of the capacitive element, the control device outputs the adjusting signal to increase capacitance of the capacitive element.

7. The operating circuit of claim 1, wherein the switching device comprises:
a first switch, coupled between the first terminal of the resistive element and the second input terminal of the amplifier;
a second switch, coupled between the first terminal of the capacitive element and the second input terminal of the amplifier;
a third switch, coupled between the second transconducting element and the first terminal of the capacitive element; and
a switch controller, coupled to the first switch, the second switch, and the third switch, for switching on the first switch and the third switch and switching off the second switch under the first mode of the operating circuit, and for switching off the first switch and the third switch and switching on the second switch under the second mode of the operating circuit.

8. The operating circuit of claim 7, wherein a second terminal of the capacitive element is coupled to a supply voltage, and the switching device further comprises:
a fourth switch, coupled between the first terminal of the capacitive element and the supply voltage, wherein the switch controller switches on the fourth switch and the first switch and switching off the second switch and the third switch under a third mode of the operating circuit.

9. An RC calibration method, comprising:
providing an amplifier having a first input terminal coupled to a reference voltage;
utilizing a first transconducting element to selectively generate a first current according to an output of the amplifier;
utilizing a second transconducting element to selectively generate a second current according to the output of the amplifier;
providing a resistive element having a first terminal coupled to the first current;
providing a capacitive element having a first terminal selectively coupled to the second current, wherein at least one of the resistive element and the capacitive element is an adjustable element;
utilizing a switching device to connect the first terminal of the capacitive element to the second current and connect the first terminal of the resistive element to a second input terminal of the amplifier under a first mode; and
utilizing the switching device to disconnect the first terminal of the capacitive element from the second current and connect the second input terminal of the amplifier to the first terminal of the capacitive element instead of the first terminal of the resistive element under a second mode.

10. The RC calibration method of claim 9, further comprising:
arranging the second current to drive the capacitive element to generate a voltage level at the first terminal of the capacitive element under the first mode;
arranging the amplifier to compare the voltage level at the first terminal of the capacitive element and the reference voltage to generate a compared signal under the second mode;
reading the compared signal under the second mode; and
utilizing a control device to selectively generate an adjusting signal to adjust the adjustable element according to at least the compared signal.

11. The RC calibration method of claim 10, further comprising:

each time the first mode is entered, counting a number of times the first mode is entered; and when the number of times the first mode is entered reaches a predetermined number, generating a statistical result by performing a statistical operation upon a plurality of compared signals each generated due to the second mode being entered, and generating the adjusting signal according to the statistical result of the compared signals, wherein each time the second mode is entered, the amplifier generates one compared signal.

12. The RC calibration method of claim 11, wherein the adjustable element is the resistive element, when the statistical result shows that the reference voltage is higher than the voltage level at the first terminal of the capacitive element, outputting the adjusting signal to reduce resistance of the resistive element, and when the statistical result shows that the reference voltage is lower than the voltage level at the first terminal of the capacitive element, outputting the adjusting signal to increase resistance of the resistive element.

13. The RC calibration method of claim 11, wherein when the adjustable element is the capacitive element, when the statistical result shows that the reference voltage is higher than the voltage level at the first terminal of the capacitive element, outputting the adjusting signal to reduce capacitance of the capacitive element, and when the statistical result shows that the reference voltage is lower than the voltage level at the first terminal of the capacitive element, outputting the adjusting signal to increase capacitance of the capacitive element.

14. The RC calibration method of claim 9, further comprising:

providing a first switch to couple between the first terminal of the resistive element and the second input terminal of the amplifier;

providing a second switch to couple between the first terminal of the capacitive element and the second input terminal of the amplifier;

providing a third switch to couple between the second current and the first terminal of the capacitive element; and utilizing a switch controller to switch on the first switch and the third switch and switch off the second switch under the first mode, and switch off the first switch and the third switch and switch on the second switch under the second mode.

15. The RC calibration method of claim 14, wherein a second terminal of the capacitive element is coupled to a supply voltage, and the RC calibration method further comprises:

providing a fourth switch to couple between the first terminal of the capacitive element and the supply voltage, and switching on the fourth switch and the first switch and switching off the second switch and the third switch under a third mode.

* * * * *